US010680164B2

(12) United States Patent
Green et al.

(10) Patent No.: US 10,680,164 B2
(45) Date of Patent: Jun. 9, 2020

(54) HALL EFFECT SENSORS WITH A METAL LAYER COMPRISING AN INTERCONNECT AND A TRACE

(71) Applicant: TEXAS INSTRUMENTS INCORPORATED, Dallas, TX (US)

(72) Inventors: Keith Ryan Green, Prosper, TX (US); Dok Won Lee, Mountain View, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/907,000

(22) Filed: Feb. 27, 2018

(65) Prior Publication Data
US 2019/0267539 A1 Aug. 29, 2019

(51) Int. Cl.
H01L 43/06 (2006.01)
G01R 15/20 (2006.01)
G01R 33/07 (2006.01)
H01L 27/22 (2006.01)
H01L 23/48 (2006.01)

(52) U.S. Cl.
CPC .......... H01L 43/065 (2013.01); G01R 15/202 (2013.01); G01R 33/077 (2013.01); H01L 23/481 (2013.01); H01L 27/22 (2013.01)

(58) Field of Classification Search
None
See application file for complete search history.

(56) References Cited

U.S. PATENT DOCUMENTS 9,024,622 B2 * 5/2015 Hohe ................. G01R 33/0017
324/202
2013/0021027 A1 * 1/2013 Ausserlechner ..... G01R 33/075
324/251
2016/0018475 A1 * 1/2016 Mozsary ............ G01R 33/0017
324/202

OTHER PUBLICATIONS

Stoica, et al.: "A Dual Vertical Hall Latch with Direction Detection", 978-1-4799-0645-1/13/, 2013 IEEE, pp. 213-216.

* cited by examiner

Primary Examiner — Erik Kielin
(74) Attorney, Agent, or Firm — Andrew R. Raiston; Charles A. Brill; Frank D. Cimino

(57) ABSTRACT

A Hall effect sensor comprises a semiconductor substrate, a first well formed in the semiconductor substrate, a first ohmic contact formed in the first well, a second ohmic contact formed in the first well, a first terminal electrically coupled to the first ohmic contact, a second terminal electrically coupled to the second ohmic contact, and a first metal layer formed over the semiconductor substrate. The first metal layer comprises a first interconnect and a first trace, where the first trace is formed over the first well, and where the first interconnect electrically couples a first part of the first well to a second part of the first well. The first and second ohmic contacts are each positioned between the first part and the second part of the first well, where the first interconnect is electrically isolated from the first trace.

19 Claims, 2 Drawing Sheets

HALL EFFECT SENSORS WITH A METAL LAYER COMPRISING AN INTERCONNECT AND A TRACE

BACKGROUND

To measure or detect a magnetic field, a Hall effect sensor develops a voltage (potential difference) in response to an applied current in one or more (semiconductor) wells, where the magnetic field has a non-zero component in the one or more wells. Measuring or detecting the voltage provides measurement or detection of the magnetic field.

SUMMARY

In accordance with at least one example, a Hall effect sensor comprises a semiconductor substrate, a first well formed in the semiconductor substrate, a first ohmic contact formed in the first well, a second ohmic contact formed in the first well, a first terminal electrically coupled to the first ohmic contact, a second terminal electrically coupled to the second ohmic contact, and a first metal layer formed over the semiconductor substrate. The first metal layer comprises a first interconnect and a first trace, where the first trace is formed over the first well, and where the first interconnect electrically couples a first part of the first well to a second part of the first well. The first and second ohmic contacts are each positioned between the first part and the second part of the first well, where the first interconnect is electrically isolated from the first trace.

In accordance with at least one example, a Hall effect sensor comprises a semiconductor substrate, a first well formed in the semiconductor substrate, a second well formed in the semiconductor substrate, a third well formed in the semiconductor substrate, a fourth well formed in the semiconductor substrate, a first trace formed over the first well, a second trace formed over the second well, a third trace formed over the third well, a fourth trace formed over the fourth well, and a port. The first trace and the second trace are electrically coupled together in series, the third trace and the fourth trace are electrically coupled together in series, and the first trace and the third trace are electrically coupled to the port.

In accordance with at least one example, a Hall effect sensor comprises a semiconductor substrate, a first well formed in the semiconductor substrate, a second well formed in the semiconductor substrate, a third well formed in the semiconductor substrate, a fourth well formed in the semiconductor substrate, a first trace formed over the first well, a second trace formed over the second well, a third trace formed over the third well, and a fourth trace formed over the fourth well. The first, second, third, and fourth traces are each electrically coupled together in parallel.

BRIEF DESCRIPTION OF THE DRAWINGS

For a detailed description of various examples, reference will now be made to the accompanying drawings in which.

DETAILED DESCRIPTION

Before a Hall effect sensor is used to measure or detect an unknown magnetic field, it can be useful to calibrate the Hall effect sensor by generating an applied magnetic field in the one or more wells of the Hall effect sensor. In accordance with the disclosed embodiments, an illustrative Hall effect sensor comprises one or more traces to carry an applied current so as to generate an applied magnetic field in the one or more wells. In some embodiments, the traces are formed from the same metal layer used to form interconnects for carrying current in the wells. In some embodiments, the traces are configured so that the applied current flows substantially (e.g., within 10% variation) evenly through the traces, so that each well experiences substantially (e.g., within 10% variation) the same magnetic field strength and direction.

Figure 1:
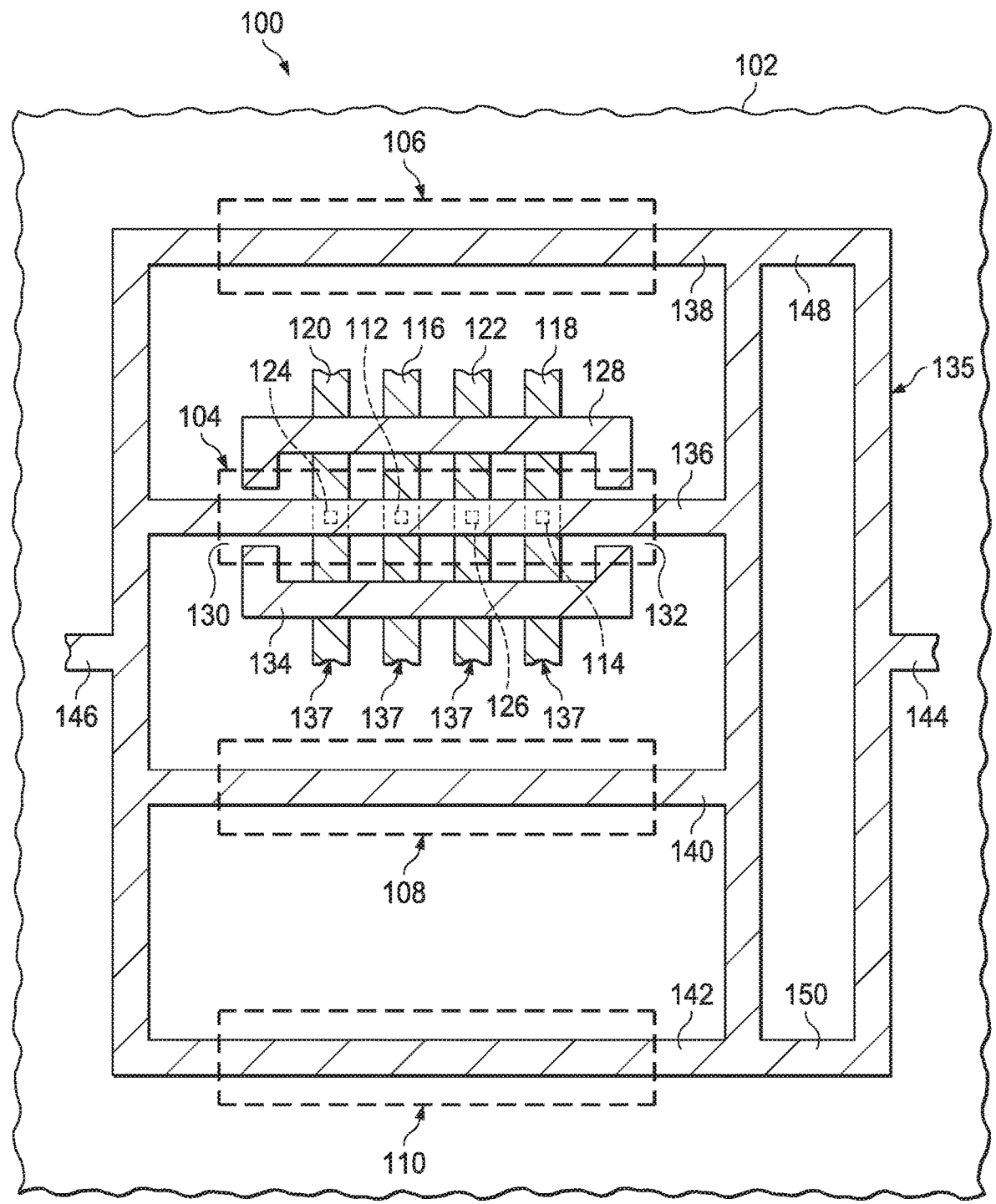
FIG. 1 shows a Hall effect sensor in accordance with various examples.

FIG. 1 shows a plan view (simplified and not drawn to scale) of an illustrative Hall effect sensor 100, comprising a semiconductor substrate 102. Formed in the semiconductor substrate 102 are: a first well 104, a second well 106, a third well 108, and a fourth well 110. In some embodiments, the illustrative Hall effect sensor 100 is a vertical Hall effect sensor that provides for the measurement or detection of a magnetic field in the plane of the semiconductor substrate 102. The semiconductor substrate 102 may be a lightly doped n-type or p-type silicon crystal. The first, second, third, and fourth wells 104, 106, 108, and 110 may be n-type or p-type wells formed by implantation or epitaxial growth.

A first ohmic contact 112 and a second ohmic contact 114 are formed in the first well 104. In some embodiments, the first and second ohmic contacts 112 and 114 are highly doped regions in the first well 104, for example highly doped n-type regions. A first terminal 116 is electrically coupled to the first ohmic contact 112, and a second terminal 118 is electrically coupled to the second ohmic contact 114. The first and second terminals 116 and 118 are electrically coupled, respectively, to the first and second ohmic contacts 112 and 114 by way of vias, but for ease of illustration such vias are not shown.

When using the illustrative Hall effect sensor 100 to detect or measure a magnetic field, in some embodiments an applied current is sourced into the first terminal 116 having a first direction, and an applied current is sourced into the second terminal 118 having a second direction opposite to the first direction. In some embodiments, a third terminal 120 and a fourth terminal 122 are used to measure the resulting voltage (potential difference) resulting from the Hall effect. The third terminal 120 is electrically coupled to a third ohmic contact 124 formed in the first well 104 by way of a via (not shown), and the fourth terminal 122 is electrically coupled to a fourth ohmic contact 126 formed in the first well 104 by way of a via (not shown). In some embodiments, the third and fourth ohmic contacts 124 and 126 are highly doped regions in the first well 104, for example highly doped n-type regions.

In some embodiments, the first, second, third, and fourth terminals 116, 118, 120, and 122 comprise metal, and are formed over one or more dielectric layers (not shown). In some embodiments, the first, second, third, and fourth terminals 116, 118, 120, and 122 are formed by etching one or more metal layers. Although not shown in FIG. 1, the first, second, third, and fourth terminals 116, 118, 120, and 122 extend over and are electrically coupled to the second, third, and fourth wells 106, 108, and 110.

In some embodiments, various metallization layers and vias (not shown) are used to route the first, second, third, and fourth terminals 116, 118, 120, and 122 so as to vary their relative orientations when electrically coupled to the first, second, third, and fourth wells 104, 106, 108, and 110. As a particular example, noting that the ordering of the terminals with respect to the first well 104 from left to right is 120, 116, 122, and 118, in some embodiments the ordering of the terminals with respect to the third well 108 from left to right might be 118, 120, 116, 122, representing a cyclic shift of the relative ordering. A cyclic shift may be implemented at each well to compensate for offsets. Some embodiments may not vary the relative orientations of the first, second, third, and fourth terminals 116, 118, 120, 122.

An interconnect 128 electrically couples a first part 130 of the first well 104 to a second part 132 of the first well 104. The first part 130 of the first well 104 is essentially an end of the first well 104, and the second part 132 of the first well 104 is essentially the other end of the first well 104. Accordingly, the first, second, third, and fourth ohmic contacts 112, 114, 124, and 126 are each positioned between the first part 130 and the second part 132 of the first well 104.

Electrically coupling the first part 130 of the first well 104 to the second part 132 of the first well 104 provides a path for current flowing between the first terminal 116 and the second terminal 118. Vias (not shown) electrically couple the interconnect 128 to ohmic contacts (not shown) in the first well 104. In some embodiments, the interconnect 128 is metal.

In some embodiments, more than one interconnect may be used to facilitate current flowing between the first terminal 116 and the second terminal 118. In the embodiment of FIG. 1, an interconnect 134 electrically couples the first part 130 of the first well 104 to the second part 132 of the first well 104. Although not shown in FIG. 1, interconnects similar to the interconnect 128 or the interconnect 134 are used for the second, third, and fourth wells 106, 108, and 110.

In some embodiments, the interconnects 128 and 134 are formed by depositing a first metal layer 135 over a dielectric layer (not shown), followed by patterning and etching to form the interconnects 128 and 134. A second metal layer 137 (or multiple metal layers) is used to form the first, second, third, and fourth terminals 116, 118, 120, and 122. No particular ordering is implied by use of the terms "first" or "second" when referring to the metal layers from which the interconnects 128 and 134 are formed, or from which the first, second, third, and fourth terminals 116, 118, 120, and 122 are formed. In the example of the illustrative Hall effect sensor 100, the first metal layer 135 from which the interconnects 128 and 134 are formed is deposited after the second metal layer 137 from which the first, second, third, and fourth terminals 116, 118, 120, and 122 are formed, where one or more dielectric layers (not shown) separate and electrically insulate the first metal layer 135 from the second metal layer 137, so that the second metal layer 137 is positioned between the first well 104 and the first metal layer 135. Additional metal layers may be deposited, patterned, and etched to provide electrical routing.

The first metal layer 135 from which the interconnects 128 and 134 are formed is also patterned and etched to form traces for carrying an applied current to generate an applied magnetic field for calibration of the illustrative Hall effect sensor 100. A first trace 136 is formed, so that the first metal layer 135 may be described as comprising the first trace 136 and the interconnects 128 and 134. The first metal layer 135 is patterned and etched so that the interconnect 128 and the interconnect 134 are each electrically isolated from the first trace 136. The first trace 136 is formed over the semiconductor substrate 102, and specifically over the first well 104. In some embodiments, the width of the first trace 136 is substantially (e.g., within 10% variation) similar to the width of the first well 104. However, so as not to obscure the features illustrated in FIG. 1, the first trace 136 is shown with a smaller width than that of the first well 104. (In some embodiments, the widths of the traces can be selected to optimize current distribution.)

The first metal layer 135 is patterned and etched to form other traces over the wells, specifically a second trace 138 over the second well 106, a third trace 140 over the third well 108, and a fourth trace 142 over the fourth well 110. Accordingly, the first metal layer 135 may be described as comprising the second trace 138, as well as the third and fourth traces 140 and 142.

In the illustrative Hall effect sensor 100, the first trace 136, the second trace 138, the third trace 140, and the fourth trace 142 are electrically coupled together in parallel. The first metal layer 135 from which these traces are formed is patterned and etched so that the first, second, third and fourth traces 136, 138, 140, and 142 are contiguous.

During a calibration procedure, an applied magnetic field is generated by providing (sourcing or sinking) an applied current at a port 144 and a port 146. The first, second, third, and fourth traces 136, 138, 140, and 142 are each coupled together at the port 144 and the port 146 so that an applied current sourced (or sunk) into (or from) the port 144 and the port 146 flows substantially (e.g., within 10% variation) evenly to the first, second, third, and fourth traces 136, 138, 140, and 142. The first metal layer 135 is patterned and etched to form a first branch 148 and a second branch 150 to separate the current path so that the applied current flows substantially (e.g., within 10% variation) evenly to the first, second, third, and fourth traces 136, 138, 140, and 142. In this way, each of the wells experience substantially (e.g., within 10% variation) the same applied magnetic field strength and direction.

Figure 2:
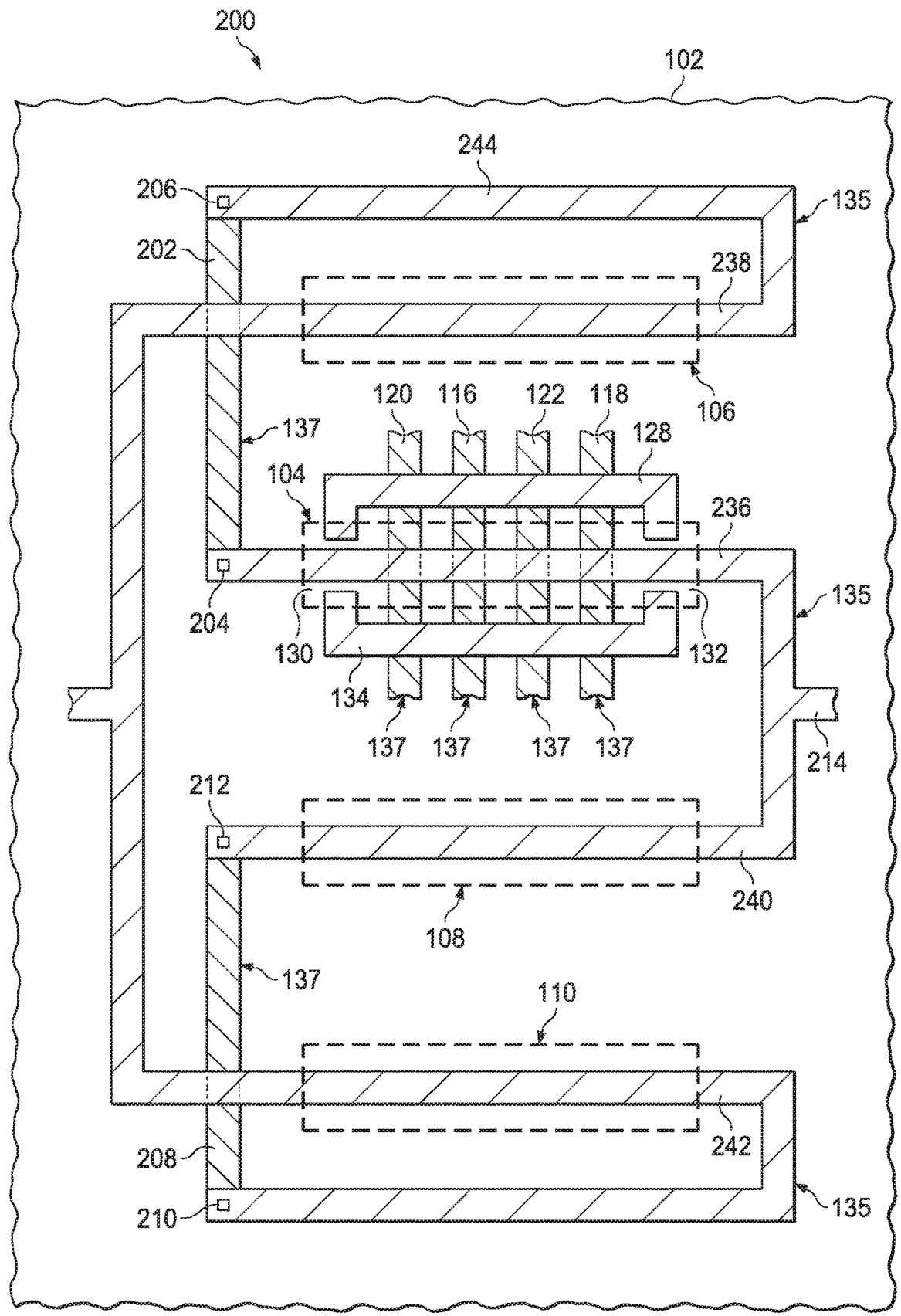
FIG. 2 shows a Hall effect sensor in accordance with various examples.

FIG. 2 shows a plan view (simplified and not drawn to scale) of an illustrative Hall effect sensor 200. Features common to both FIG. 2 and FIG. 1 have the same numeric labels. Referring to FIG. 2, the first metal layer 135 is patterned and etched so that traces over the wells are electrically coupled in series. The first metal layer 135 is patterned and etched to comprise a first trace 236 over the first well 104 and a second trace 238 over the second well 106, where the first trace 236 and the second trace 238 are electrically coupled together in series. An interconnect 202, with vias 204 and 206, electrically couple in series the first trace 236 and the second trace 238. In the embodiment illustrated in FIG. 2, the interconnect 202 is formed from the second metal layer 137.

The first metal layer 135 is patterned and etched to comprise a third trace 240 over the third well 108 and a fourth trace 242 over the fourth well 110, where the third trace 240 and the fourth trace 242 are electrically coupled together in series. An interconnect 208, with vias 210 and 212, electrically couple in series the third trace 240 and the fourth trace 242. In the embodiment illustrated in FIG. 2, the interconnect 208 is formed from the second metal layer 137.

The first metal layer 135 is patterned and etched so that the third trace 240 is contiguous with the first trace 236. The first trace 236 and the third trace 240 are coupled together at a port 214, so that an applied current sourced into the port 214 flows substantially (e.g., within 10% variation) evenly to the first and third traces 236 and 240. Because of the symmetrical layout where the first trace 236 is in series with the second trace 238 and the third trace 240 is in series with the fourth trace 242, an applied current flows evenly in the first and third traces 236 and 240, resulting in substantially (e.g., within 10% variation) the same amount of applied current flowing through each trace so that each well experiences substantially (e.g., within 10% variation) the same applied magnetic field strength and direction.

In some embodiments, the direction of current flow is taken into account when selecting the values of the spacing between some of the illustrated interconnects and traces. For example, an interconnect 244 and the interconnect 202 together electrically couple the first trace 236 to the second trace 238. Current flow direction in the interconnect 244 is opposite to that of the second trace 238 and the first trace 236. Accordingly, in some embodiments the interconnect 244 is formed at a larger distance from the second trace 238 than the distance between the second trace 238 and the first trace 236. Similar remarks apply to the other traces in FIG. 2. Because FIG. 2 is not drawn to scale, the different values of the spacing between the traces are not illustrated.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A Hall effect sensor comprising:
a semiconductor substrate;
a first metal layer formed over the semiconductor substrate, the first metal layer defining a first port and a second port;
first, second, third and fourth traces formed over respective first, second, third and fourth wells formed in the semiconductor substrate, the first, second, third and fourth traces connected between the first port and the second port such that a respective current path from the first port to the second port through each of the first, second, third and fourth traces is oriented in a same direction;
first and second ohmic contacts formed in the first well;
a first terminal conductively connected to the first ohmic contact
and a second terminal conductively connected to the second ohmic contact, the first terminal located between the first ohmic contact and the first trace and the second terminal located between the second ohmic contact and the second trace; and
a first interconnect conductively connecting a first part of the first well to a second part of the first well, wherein the first and second ohmic contacts are each positioned between the first part and the second part of the first well.

2. The Hall effect sensor of claim 1, further comprising a second interconnect conductively coupling the first part of the first well to the second part of the first well, the first trace located between the first and second interconnects.

3. The Hall effect sensor of claim 1, wherein the first, second, third and fourth traces are formed in the first metal layer, and the first and second terminals are formed in a second metal layer.

4. The Hall effect sensor of claim 3, wherein the second metal layer is positioned between the first well and the first metal layer.

5. The Hall effect sensor of claim 1, further comprising:
a third ohmic contact formed in the first well;
a fourth ohmic contact formed in the first well;
a third terminal conductively connected to the third ohmic contact; and
a fourth terminal conductively connected to the fourth ohmic contact.

6. The Hall effect sensor of claim 1, wherein the first, second, third, and fourth traces are configured such that in the event a current is directed between the first and second ports the current is divided about evenly between the first, second, third, and fourth traces.

7. The Hall effect sensor of claim 1, wherein the first, second, third, and fourth traces are arranged to form four parallel current paths between the first and second ports.

8. The Hall effect sensor of claim 1, wherein the first, second, third, and fourth traces are arranged to form first and second parallel current paths, the first current path crossing the first and second wells, and the second current path crossing the third and fourth wells.

9. A Hall effect sensor comprising:
a semiconductor substrate;
a first metal layer formed over the semiconductor substrate, the first metal layer defining a first port and a second port;
first, second, third and fourth traces formed over respective first, second, third and fourth wells formed in the semiconductor substrate, the first, second, third and fourth traces connected between the first port and the second port such that a respective current path from the first port to the second port through each of the first, second, third and fourth traces is oriented in a same direction;
wherein the first trace and the second trace are conductively connected together in series between the first port and the second port by a fifth trace that crosses the first trace in a second different metal layer; and
wherein the third trace and the fourth trace are conductively connected together in series between the first port and the second port by a sixth trace that crosses the third trace in the second different metal layer.

10. The Hall effect sensor of claim 9, wherein the first trace and the third trace are electrically coupled to the first port to provide, on the condition that a current is sourced at the first port, a first half of the current to the first trace and a second half of the current to the third trace.

11. The Hall effect sensor of claim 10, further comprising:
a first ohmic contact formed in the first well;
a second ohmic contact formed in the first well;
a first terminal electrically coupled to the first ohmic contact;
a second terminal electrically coupled to the second ohmic contact; and
an interconnect electrically coupling a first part of the first well to a second part of the first well, wherein the first and second ohmic contacts are each positioned between the first part and the second part of the first well.

12. A Hall effect sensor comprising:
a semiconductor substrate;
first, second, third and fourth wells formed in the semiconductor substrate;
a first trace formed over the first well, a second trace formed over the second well, a third trace formed over the third well, and a fourth trace formed over the fourth well, each of the first, second, third and fourth traces passing between respective pairs of interconnects, each pair of interconnects connecting a first end of a corresponding well to a second end of the corresponding well;
a first port to which respective first ends of each of the first, second, third and fourth traces are connected; and
a second port to which respective second ends of each of the first, second, third and fourth traces are connected, wherein the first, second, third, and fourth traces are each electrically coupled together in parallel such that in the event that a current is sourced at the first port, a portion of the current flows through each of the first, second, third and fourth traces in a same direction.

13. The Hall effect sensor of claim 12, wherein the first, second, third, and fourth traces are electrically coupled to the first port such that, in the event that the current is sourced at the first port, a first half of the current is directed to the first and second traces and a second half of the current is directed to the third and fourth traces.

14. The Hall effect sensor of claim 13, further comprising:
a first ohmic contact formed in the first well;
a second ohmic contact formed in the first well;
a first terminal electrically coupled to the first ohmic contact;
a second terminal electrically coupled to the second ohmic contact; and
an interconnect electrically coupling a first part of the first well to a second part of the first well, wherein the first and second ohmic contacts are each positioned between the first part and the second part of the first well.

15. An integrated circuit, comprising:
first, second, third and fourth elongate n-wells located in a p-type semiconductor substrate;
first, second, third and fourth traces each located over and running parallel to a long axis of a corresponding one of the first, second, third and fourth elongate n-wells;
first and second current ports in a metal layer over the substrate, and
first, second, third and fourth pairs of interconnects corresponding respectively to the first, second, third and fourth elongate n-wells, each pair of interconnects connecting a first end of its corresponding first, second, third or fourth elongate n-well to a second end of its corresponding first, second, third or fourth elongate n-well, wherein each of the first, second, third and fourth traces crosses each of the first, second, third and fourth elongate n-wells between corresponding pairs of the interconnects;
wherein the first, second, third and fourth traces are interconnected with the first and second ports such that in the event a current is sourced at the first port and sunk at the second port, approximately equal portions of the current flow through each of the first, second, third and fourth traces in a same direction between the first port and the second port.

16. The integrated circuit as recited in claim 15, wherein the first and second traces are interconnected such that in the event the current is sourced at the first port, a same portion of the current flows serially through both the first trace and the second trace.

17. The integrated circuit as recited in claim 16, wherein in the event the current is sourced at the first port, the same current portion flows in a first direction through the first and second traces, and flows in a second direction opposite the first direction in a circuit path connecting the first and second traces.

18. The integrated circuit as recited in claim 15, wherein the first, second, third and fourth traces and the pairs of interconnects are formed in same metal level over the semiconductor substrate.

19. The integrated circuit as recited in claim 15, further comprising a plurality of terminal lines running normal to the first, second, third and fourth traces, each of the terminal lines being conductively connected to at least one of the first, second, third and fourth elongate n-wells.

* * * * *